United States Patent [19]

Knors et al.

[11] Patent Number: 5,362,599
[45] Date of Patent: Nov. 8, 1994

[54] FAST DIAZOQUINONE POSITIVE RESISTS COMPRISING MIXED ESTERS OF 4-SULFONATE AND 5-SULFONATE COMPOUNDS

[75] Inventors: Christopher J. Knors, Bound Brook, N.J.; Steve S. Miura, Poughkeepsie, N.Y.; Melvin W. Montgomery, New Windsor, N.Y.; Wayne M. Moreau, Wappingers Falls, N.Y.; Randolph J. Smith, Newburgh, N.Y.

[73] Assignee: International Business Machines Corporations, Armonk, N.Y.

[21] Appl. No.: 792,115

[22] Filed: Nov. 14, 1991

[51] Int. Cl.$^5$ .................... G03F 7/023; G03F 7/30
[52] U.S. Cl. .................... 430/192; 430/165; 430/191; 430/193; 534/557
[58] Field of Search ............... 430/192, 193, 165, 191; 534/557

[56] References Cited

U.S. PATENT DOCUMENTS

| | | | |
|---|---|---|---|
| 3,106,465 | 10/1963 | Neugebauer | 96/33 |
| 3,130,048 | 4/1964 | Fritz et al. | 96/33 |
| 3,188,210 | 6/1965 | Fritz et al. | 430/193 |
| 4,266,000 | 5/1981 | Stahlofen et al. | 430/192 |
| 4,397,937 | 8/1983 | Clecak et al. | 430/192 |
| 4,732,836 | 3/1988 | Potvin et al. | 430/192 |
| 4,732,837 | 3/1988 | Potvin et al. | 430/192 |
| 4,818,658 | 4/1989 | Martin et al. | 430/193 |
| 4,839,256 | 6/1989 | Muller | 430/192 |
| 4,873,169 | 10/1989 | Erdmann et al. | 430/192 |
| 4,906,549 | 3/1990 | Asaumi et al. | 430/192 |
| 4,943,511 | 7/1990 | Lazarus et al. | 430/192 |
| 4,959,292 | 9/1990 | Blakeney et al. | 430/192 |
| 5,089,373 | 2/1992 | Uenishi et al. | 430/192 |
| 5,153,096 | 10/1992 | Uenishi et al. | 430/192 |
| 5,306,596 | 4/1994 | Oie et al. | 430/192 |

FOREIGN PATENT DOCUMENTS

| | | | |
|---|---|---|---|
| 273026 | 6/1988 | European Pat. Off. | 430/192 |
| 335836 | 10/1989 | European Pat. Off. | |

OTHER PUBLICATIONS

Buhr et al. "Image Reversal Resist for g-line Exposure: Chemistry and Lithograph Evaluation" *Proc. SPIE* 1086, 117-128 (1989).

Blum et al. "A Study of the Dissolution Kinetics of a Positive Photoresist Using Organic Acids To Simulate Exposed Photoactive Compounds" *Proc. SPIE* 771, 148-153 (1987).

*Primary Examiner*—Charles L. Bowers, Jr.
*Assistant Examiner*—John S. Chu
*Attorney, Agent, or Firm*—Heslin & Rothenberg

[57] ABSTRACT

Positive photoresist compositions and methods using the photoresist compositions for making submicron patterns in the production of semiconductor devices are disclosed. The photoresists contain sensitizers that are mixed naphthoquinonediazide 4- and 5- sulfonic acid esters of bis and tris(mono, di and trihydroxyphenyl) alkanes.

6 Claims, No Drawings

FAST DIAZOQUINONE POSITIVE RESISTS COMPRISING MIXED ESTERS OF 4-SULFONATE AND 5-SULFONATE COMPOUNDS

TECHNICAL FIELD

This invention relates to positive photoresist compositions and to methods utilizing the photoresist compositions for making submicron patterns in the production of semiconductor devices. The photoresists contain sensitizers that are mixed naphthoquinonediazide 4- and 5-sulfonic acid esters of bis and tris(mono, di and trihydroxyphenyl) alkanes.

BACKGROUND ART

The production of 4 megabit or larger DRAM semiconductors involves the creation of images having submicron dimensions. These are commonly produced by optical lithography using I-line (365 nm) radiation. The resists used in lithographic production of very large scale integration (VLSI) circuits must have sufficient imageability to produce straight walled features in the resist, high resistance to etching of unexposed areas, high contrast, and high operational photospeed. Straight walls are important because sloping walls lead to changes in dimensions and loss of resolution as the resist is eroded by the etching process. Resistance to etching is important for the same reason. High photospeed increases throughput and thereby minimizes the investment in very expensive equipment. High contrast allows tools with lower numerical aperture and larger fields of exposure to be used. Contrast is defined as the ratio of the dissolution rate of the exposed resin (R) to the dissolution rate of the unexposed resin ($R_0$).

Positive resists are preferred for VLSI. Known I-line photoresist compositions are naphthoquinone diazide sulfonate esters of hydroxyaromatic compounds dispersed in novolak resins as disclosed in U.S. Pat. Nos. 3,130,048 and 3,106,465. Since the function of the unexposed naphthoquinone diazide ester is to inhibit the dissolution of the novolak resin, it is important it be highly miscible with the novolak resin in the film and in solution.

Among the different phenols with which the naphthoquinone diazide sulfonates can be esterified, hydroxy benzophenones and biphenyls have been the most widely used. Molecules that do not contain a benzophenone chromophore are preferred for VLSI applications because the absorbance of benzophenone at 365 nm leads to a residual unbleachable component which can give sloped sidewalls in photoresist images.

4-Sulfonate esters are said to possess advantages for image reversal [G. Buhr, Proc. SPIE 1086, 117(1989)]. In addition, they have the potential to be faster resists than the 5-sulfonates since irradiation produces both a sulfonic acid and a carboxylic acid in the case of the 4-sulfonate, but only a carboxylic acid in the case of the 5-sulfonate. [G. Buhr. Proc. SPIE, 1086, 117(1989); Blum, Proc. SPIE, 771, 148(1987)]. The irradiation products of the 4-sulfonate facilitate the development of the exposed image in simple metal ion free developers (tetramethylammonium hydroxide) which, in the case of 5-sulfonates, usually require surfactants to remove the exposed photoresist completely. The 4-sulfonic acid esters also possess higher absorbance at the I line than the corresponding 5-sulfonates, thus providing higher photospeed and improved internal masking.

Despite the theoretical advantages of the 4-sulfonates, 5-sulfonates remain by far the more popular esters for use in photoresists because of their superior solubility in the novolak resin and casting solvents (U.S. Pat. Nos. 4,266,000 and 4,906,549). For example, it is difficult to achieve more than 15% by weight of solid film with 4-sulfonic acid esters of hydroxybenzophenone. One of the earlier attempts to induce solubility in 4-sulfonic acid esters of benzophenone relied upon leaving free hydroxy groups in di and trihydroxybenzophenones (U.S. Pat. No. 3,130,048). However, the resistance to alkaline developers of compositions containing free hydroxyls is inadequate for practical purposes, especially for VLSI where any loss of unexposed resist results in undesirable, sloping wall profiles. Producing a photoresist that takes advantage of the superior intrinsic characteristics of naphthoquinonediazide 4-sulfonates while maintaining high contrast and good solubility has, until the present invention, remained elusive.

U.S. Pat. No. 4,266,000 discloses naphthoquinone diazide 5-sulfonic acid esters of halogenated benzophenones and bisphenols. Additives to the composition include trihydroxybenzophenone and naphthoquinonediazide 4-sulfonyl chloride. The sulfonyl chloride would be expected to readily hydrolyze to free acid, reducing the shelf life of the resist in solution and introducing the potential for corroding metal surfaces.

U.S. Pat. No. 4,839,256 discloses ink repellent printing plates containing perfluoroalkyl monoethers of dihydroxyaromatics in which the naphthoquinonediazidosulfonate esterfies the other (non-ether) hydroxy site on the benzene ring.

U.S. Pat. No. 4,732,836 discloses photoresist compositions containing tri- and tetrahydroxybenzophenones esterified with mixtures of 4-naphthoquinone diazide sulfonyl chloride and other acid chlorides. Although the generic disclosure would encompass diphenylmethane esters, in fact the single example is of 2,3,4-trihydroxybenzophenone. Moreover, the benzophenone contains no 5-sulfonate esters but rather uses only photochemically inert aliphatic and aromatic acids to block the hydroxyls that are unesterified by 4-sulfonyl chloride. This provides solubility and a lower $R_0$ but at the expense of photospeed.

U.S. Pat. No. 4,732,837 discloses analogous esters from the 5-sulfonyl chloride.

U.S. Pat. No. 4,873,169 discloses a process for the preparation of low metal content napththoquinonediazide 5-sulfonic acid esters using organic amines as esterification agents.

U.S. Pat. No. 4,906,549 discloses specific phenolic formaldehyde resins for use in conjunction with naphthoquinonediazide 5-sulfonate esters of tri and tetrahydroxy benzophenones in photoresist compositions.

European patent application EP 335,836 discloses positive photoresist compositions containing an alkali soluble resin, a naphthoquinonediazide 5-sulfonate ester with 1,3,5 trihydroxybenzene and an additive of an aromatic hydroxy compound.

U.S. Pat. No. 4,397,937 discloses naphthoquinonediazide 5-sulfonyl esters of unsymmetrical aliphatic diols. Although the generic description includes mixed esters of the diols with 5- and 4-sulfonic acids, no examples of such are disclosed.

U.S. Pat. No. 4,943,511 discloses mono, di- and triesters of 2,3,4-trihydroxybenzophenone with 1,2-naphthoquinone-2-diazo-4-sulfonic acid. Photoresist compositions comprise these esters in combination with particularly chosen cresol formaldehyde resins. The patent demonstrates two approaches (partial esterification and resin choice) that the art has suggested for achieving solubility of 4-sulfonate esters.

There remains a need for a positive working photoresist composition that is based on readily available novolak resins and that provides high photospeed, high contrast, good resistance to etching in unexposed areas, straight-walled profiles, clean development with simple, nonmetallic bases, rapid development in simple, nonmetallic bases, and high solubility in the casting solution.

DISCLOSURE OF INVENTION

It is an object of the present invention to provide a positive working photoresist composition that has high photospeed, high contrast, good resistance to etching in unexposed areas, straight-walled profiles, clean development with simple, nonmetallic bases, rapid development in simple, nonmetallic bases, and high solubility in the casting solution.

It is a further object of the invention to provide mixed esters of a polyphenol with 4- and 5-naphthoquinone diazide sulfonates that are highly soluble in readily available novolak resins and casting solvents.

It is a further object of the invention to provide a process for optical lithography that is rapid, efficient, precise and economical.

In one aspect, the invention relates to positive working photoresist compositions comprising, in admixture, 100 parts by weight of phenolic resin and from 18 to 100 parts by weight of a dissolution inhibitor which is a mixed ester derived from the esterification of a polyphenol with a mixture of naphthoquinonediazide 4- and 5-sulfonic acids, the polyphenol having the formula [Ph(OH)$_x$]$_y$CR$_{4-y}$ wherein Ph is a benzene ring, x is an integer from 1 to 3, y is 2 or 3, and R is hydrogen, fluorine, methyl, ethyl, trifluoromethyl or pentafluoroethyl. The dissolution inhibitor has greater than 80% of the phenolic hydroxyl groups esterified and contains from 10 to 90 mole percent of 4-sulfonate esters and from 90 to 10 mole percent of 5-sulfonate esters, with the proviso that when R is methyl and y is 2, the mole percent of 4-sulfonate esters is from 10 to 80.

Preferred phenolic resins are cresol-formaldehyde resins containing, as the cresol component, from 40 to 60 percent meta cresol and the remainder para cresol.

Preferred dissolution inhibitors are those having greater than 90% esterification of the polyphenol hydroxyl groups. Preferred structural classes of polyphenol esters are 1) those in which y is two, R is methyl, x is one and the mixture of esters is about 50 mole percent 4-sulfonate esters and about 50 mole percent 5-sulfonate esters, represented by the following formula:

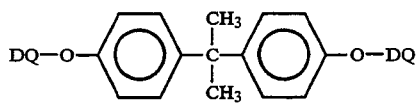

in which DQ is a 1,2 naphthoquinone diazide 4-sulfonate residue (4 -DQ)

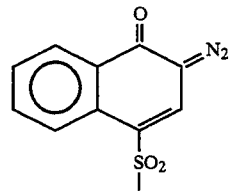

or a 1,2 naphthoquinone diazide 5-sulfonate residue (5-DQ)

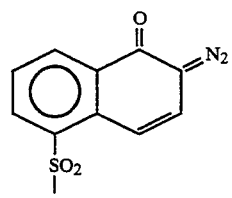

2) those in which y is two, R is trifluoromethyl, x is one and the mixture of esters is about 90 mole percent 4-sulfonate esters and about 10 mole percent 5-sulfonate esters, represented by the formula

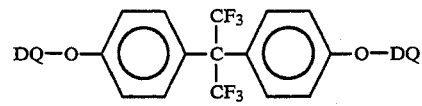

3) and those in which y is three, R is methyl, X is one and the mixture of esters is about 50 mole percent 4-sulfonate esters and about 50 mole percent 5-sulfonate esters, represented by the formula

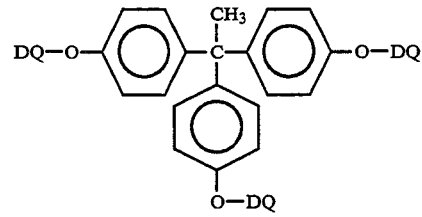

In a further aspect, the invention relates to a process for optical lithography which comprises the steps of:

a) applying a photoresist composition as described above to a substrate;

b) exposing the photoresist composition to radiation of wavelength 300 to 500 nm, preferably 365 nm; and c) developing the photoresist composition, preferably by treatment with an aqueous solution of tetramethylammonium hydroxide.

In a further aspect the invention relates to semiconductor devices fabricated using the compositions and processes described above.

As used herein the term "novolak" resins refers to phenol-formaldehyde resins. Alkali-soluble novolak resins, which may be used for preparing photosensitive compositions, are known in the art. A procedure for their manufacture is described in *Chemistry and Application of Phenolic Resins*, Knop, A. and Scheib, W.; Springer Verlag, New York, 1979 in Chapter 4 which is incorporated herein by reference.

BEST MODE FOR CARRYING OUT THE INVENTION

According to the invention, novel mixed esters of polyhydroxy aromatic compounds with naphthoquinone diazide 4-sulfonic acids and 5-sulfonic acids are prepared analogously to known pure 4- or pure 5-sulfonate esters as described in U.S. Pat. No. 4,397,937 (which is incorporated herein by reference) by reacting a mixture of the sulfonyl chlorides with the polyhydroxy aromatic compound in the presence of an inorganic or organic base at controlled acidity, followed by washing to remove the base. One hundred parts of the diazoquinone sensitizer is mixed with from 18 to 100 parts of the appropriate phenolic resin. Suitable resins are derived from meta, para, and other cresol-formaldehyde polymers.

Radiation sensitive compositions of the invention may also contain conventional photoresist composition ingredients such as solvents, actinic and contrast dyes, anti-striation agents, plasticizers, speed enhancers, and the like. These additional ingredients may be added to the binder resin and photoactive compound before the solution is coated onto the substrate.

The resins and sensitizers may be dissolved in a solvent or solvents to facilitate their application to the substrate. Examples of suitable solvents include methoxyacetoxy propane, ethyl cellosolve acetate, n-butyl acetate, ethyl lactate, ethyl 3-ethoxy propionate, propylene glycol alkyl ether acetates, or mixtures thereof and the like. Cosolvents such as xylene or n-butylacetate may also be used. The preferred amount of solvent may be from about 50% to about 500%, or higher, by weight, more preferably, from about 100% to about 400% by weight, based on combined resin and sensitizer weight.

The prepared radiation sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicone resins, gallium arsenide, silicon nitride, tantalum, copper, polysilicon, ceramics and aluminum/copper mixtures. The coating surfaces of these substrates may or may not be primed with a conventional adhesion promoter (e.g. hexamethyldisilazane) before the photoresist coating is applied.

The photoresist coatings produced by the above described procedure are particularly suitable for application to silicon wafers coated with a silicon dioxide or silicon nitride layer such as are utilized in the production of microprocessors and other miniaturized integrated circuit components. An aluminum or aluminum-coated substrate may be used as well. The substrate may also comprise various polymeric resins, especially transparent polymers such as polyesters and polyolefins.

After the resist solution is coated onto the substrate, the coated substrate is baked at approximately 70° C. to 125° C. until substantially all the solvent has evaporated and only a uniform radiation sensitive coating remains on the substrate.

The coated substrate can then be exposed to radiation, especially radiation at 365 nm in any desired exposure pattern, produced by use of suitable masks, negatives, stencils, templates, and the like. Conventional imaging processes or apparatus currently used in processing photoresist-coated substrates may be employed with the present invention.

The exposed resist-coated substrates are preferably subject to a post exposure bake at a temperature from about 90° C. to about 120° C. for about 30 to about 300 seconds to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developer for this invention is an aqueous solution of tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 4 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry unions on silicon/silicon dioxide-type substrates, the developed substrates may then be treated with a buffered hydrofluoric acid etching solution or may be etched with a plasma gas. The resist compositions of the present invention are resistant to a wide variety of acid etching solutions or plasma gases and provide effective protection for the resist-coated areas of the substrate.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLE 1

Mixed esters of 2,2-bis(4-hydroxyphenyl)propane (bisphenol A) were prepared by the method described in U.S. Pat. No. 4,397,937, column 3, lines 46 to 64. The ratio of 4-DQ to 5-DQ esters was determined by the stoichiometry of the mixture of sulfonyl chlorides that was added. Thus, to prepare a 50:50 mixture of 4-DQ and 5-DQ esters, one equivalent of 2,2-bis(4-hydroxyphenyl)propane was reacted with a mixture of one equivalent of 4-sulfonyl chloride and one equivalent of 5-sulfonyl chloride. It will be apparent to those skilled in the art that the product resulting from the reaction described is a mixture of esters which is predominantly the 4-DQ, 5-DQ mixed ester accompanied by a certain amount of 4-DQ, 4-DQ and 5-DQ, 5-DQ esters. For this reason mixtures of esters are characterized by the mole percent of a given sulfonyl ester in the mixture. In analogous fashion, the reaction of one equivalent of 2,2-bis(4-hydroxyphenyl) propane with 1.8 equivalents of 4-DQ chloride and 0.2 equivalents of 5-DQ chloride produces a mixture of esters, characterized as 90:10 mole percent, which is predominantly the 4-DQ, 4-DQ ester accompanied by lesser amounts of 4-DQ, 5-DQ ester and very minor amounts of 5-DQ, 5-DQ ester.

The esterification is carried out under conditions that provide greater than 90% esterification of available hydroxyl functions.

The mixtures of esters were prepared as described above and then analyzed by IR (to assure complete esterification) and NMR (to determine the ratio of esters in the product mix).

The solubility of the mixture in ethyl ethoxy propionate (EEP) casting solvents was determined at a level comprising at least 15% by weight of the solid content or at least 2.4% by weight of the casting solvent.

In Table 1, the solubility test in EEP reveals that both the pure 4- and 5-sulfonate esters of naphthoquinone diazides derived from bisphenol A are, in fact, insoluble. However, the mixed ester is soluble, and many of the ester mixtures are soluble. The esters in this table are esterified to greater than or equal to 95 mole percent.

The ratio of the exposed dissolution rate to the unexposed dissolution rate (R/Ro) is given for two entries. The R/Ro measurement was determined at 80% esterification for the pure 5-ester because products having higher esterification levels were too insoluble to test.

TABLE 1

| BISPHENOL A DERIVATIVES | | | |
|---|---|---|---|
| 4-DQ | 5-DQ | SOLUBILITY | R/Ro |
| 0% | 100% | INSOL | 42* |
| 10% | 90% | SOL | |
| 33% | 67% | SOL | |
| 50% | 50% | SOL | 193 |
| 67% | 33% | SOL | |
| 90% | 10% | INSOL | |
| 100% | 0% | INSOL | |

*for a 80% esterified sample

EXAMPLE 2

A resist formulation consisting of 5.0 g of the 50/50 mixed 4- and 5- sulfonate esters of naphthoquinone diazides of bisphenol A, 23.0 g of meta cresol/para cresol (48/48) formaldehyde resin, and 72 grams of ethyl 3-ethoxypropionate was spin cast to 1.09 μm on a silicon wafer, prebaked at 100° C. for 1 min, exposed at 100J/cm$^2$ on a GCA 1635i 0.35NA I-line stepper, post expose baked at 95° C. for 1 min., developed in 0.24N TMAH, and examined by electron microscopy. Straight walled profiles were observed for images down to 0.6 micron. Similar evaluation of the 80% esterified 5-sulfonate derivative gave poorer lithographic image quality. This along with the R/Ro data and the solubility data demonstrates the superior performance of the mixed esters over the single component esters.

EXAMPLE 3

The sulfonate esters of hexafluorobisphenol A (formula: x=1, y=2, R=CF$_3$) were prepared and similarly tested for solubility as in Example 1 above. The results are shown in Table 2 below.

TABLE 2

| HEXAFLUOROBISPHENOL A | | |
|---|---|---|
| 4-DQ | 5-DQ | SOLUBILITY |
| 100% | 0% | SOL |
| 50% | 50% | SOL |
| 0% | 100% | INSOL |

EXAMPLE 4

The sulfonate esters of tris(hydroxyphenyl)ethane (formula: x=1, y=3, R=CH$_3$) were prepared and evaluated for solubility as in Example 1 above. The results are shown in Table 3.

TABLE 3

| TRIS(HYDROXYPHENYL)ETHANE | | |
|---|---|---|
| 4-DQ | 5-DQ | SOLUBILITY |
| 100% | 0% | SOL* |
| 67% | 33% | SOL |
| 50% | 50% | SOL |
| 0% | 100% | INSOL |

*The ester was initially soluble, but the solution appeared unstable.

EXAMPLE 5

Resist formulations were prepared from the pure 4-sulfonate ester and the 67/33 mixed 4- and 5-sulfonate esters of tris(hydroxyphenyl)ethane by mixing 4.8 g of the respective naphthoquinone diazides with 19.2 g of meta cresol/para cresol (48/48) formaldehyde resin in 76 g of ethyl 3-ethoxypropionate. The resists were spin cast to 1.09 micron films on silicon wafers, prebaked at 95° C. for 1 min, exposed at 80 mJ/cm2 on a GCA 1635i 0.35 NA I-line stepper, post expose baked at 95° C. for 1 min and developed in 0.24N TMAH. The resist profiles for the 67/33 mixed ester sample were steeper in profile than the 4-sulfonate ester. Both gave good quality lithographic images.

While the invention has been particularly shown and described with reference to preferred embodiments thereof, it will be understood by those skilled in the art that other changes in form and details may be made therein without departing from the spirit and scope of the invention.

We claim:

1. A positive working photoresist composition comprising, in admixture, 100 parts by weight of phenolic-aldehyde resin and from 18 to 100 parts by weight of a dissolution inhibitor which is a mixed ester derived from the esterification of a polyphenol with a mixture of naphthoquinone diazide 4- and 5-sulfonic acids, said polyphenol having the formula (Ph(OH)$_x$)$_y$CR$_{4-y}$ wherein Ph is a benzene ring, x is an integer from 1 to 3, y is 2 or 3, and R is hydrogen, fluorine, methyl, ethyl, trifluoromethyl or pentafluoroethyl, said dissolution inhibitor having greater than 80% of hydroxyl groups esterified, and said dissolution inhibitor containing from 10 to 90 mole percent of 4-sulfonate esters and from 90 to 10 mole percent of 5-sulfonate esters, with the proviso that when R is methyl and y is 2, the mole percent of 4-sulfonate esters is from 10 to 80.

2. A composition according to claim 1 wherein said polyphenol has greater than about 90% of hydroxyl groups esterified.

3. A composition according to claim 1 wherein, in said dissolution inhibitor, y is two, R is methyl, x is one and said mixture of esters is about 50 mole percent 4-sulfonate esters and about 50 mole percent 5-sulfonate esters.

4. A composition according to claim 1 wherein, in said dissolution inhibitor, y is two, R is trifluoromethyl, x is one and said mixture of esters is about 90 mole percent 4-sulfonate esters and about 10 mole percent 5-sulfonate esters.

5. A composition according to claim 1 wherein in dissolution inhibitor, y is three, R is methyl, x is one and said mixture of esters is about 50 mole percent 4-sulfonate esters and about 50 mole percent 5-sulfonate esters.

6. A composition according to claim 1 wherein said phenolic resin is a cresol-formaldehyde resin containing, as the cresol component, from 40 to 60 percent meta cresol and the remainder predominantly para cresol.

* * * * *